(12) United States Patent
Shinohara (10) Patent No.: US 6,914,321 B2
(45) Date of Patent: Jul. 5, 2005

(54) SEMICONDUCTOR DEVICE (75) Inventor: Toshiaki Shinohara, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/895,025

(22) Filed: Jul. 2, 2001

(65) Prior Publication Data
US 2002/0113302 A1 Aug. 22, 2002

(30) Foreign Application Priority Data

Feb. 20, 2001 (JP) ........................................ 2001-043439

(51) Int. Cl.⁷ .............................................. H01L 23/02
(52) U.S. Cl. .................... 257/678; 257/691; 257/723; 257/720; 257/718; 257/502
(58) Field of Search ................ 257/502, 678, 257/687, 691, 706–707, 718, 717, 720, 723–725, 796, 777, 646, 578; 438/106, 121, 122, 125, 107, 109, 110, 117

(56) References Cited

U.S. PATENT DOCUMENTS

| 4,012,832 | A | * | 3/1977 | Crane ......................... 257/700 |
| 4,910,584 | A | * | 3/1990 | Mizuo ......................... 257/713 |
| 4,920,405 | A | * | 4/1990 | Itoh et al. .................... 257/687 |
| 5,291,065 | A | * | 3/1994 | Arai et al. .................... 257/723 |
| 5,311,057 | A | * | 5/1994 | McShane ..................... 257/676 |
| 5,317,194 | A | * | 5/1994 | Sako ........................... 257/777 |
| 5,371,403 | A | * | 12/1994 | Huang et al. ................ 257/691 |
| 5,379,187 | A | * | 1/1995 | Lee et al. .................... 257/720 |
| 5,440,169 | A | | 8/1995 | Tomita et al. |
| 5,455,457 | A | * | 10/1995 | Kurokawa ................... 257/712 |
| 5,488,256 | A | * | 1/1996 | Tsunoda ...................... 257/723 |
| 5,559,374 | A | * | 9/1996 | Ohta et al. ................... 257/723 |
| 5,621,243 | A | * | 4/1997 | Baba et al. .................. 257/712 |
| 5,767,573 | A | | 6/1998 | Noda et al. |
| 5,783,466 | A | | 7/1998 | Takahashi et al. |
| 5,942,797 | A | * | 8/1999 | Terasawa ..................... 257/723 |
| 6,060,772 | A | * | 5/2000 | Sugawara et al. ........... 257/678 |
| 6,297,549 | B1 | * | 10/2001 | Hiyoshi ....................... 257/703 |

FOREIGN PATENT DOCUMENTS

| DE | 44 00 341 | | 7/1994 | |
| DE | 196 25 240 | | 4/1997 | |
| DE | 199 08 749 | | 8/2000 | |
| EP | 0 650 193 | | 4/1995 | |
| JP | 9-213877 | | 8/1997 | |
| JP | 10-93015 | | 4/1998 | |
| JP | 10-093015 | * | 4/1998 | .................... 25/18 |
| JP | 11-204700 | | 7/1999 | |
| JP | 2001-118961 | * | 4/2001 | .................... 23/28 |

* cited by examiner

*Primary Examiner*—Eddie Lee
*Assistant Examiner*—Quang Vu
(74) *Attorney, Agent, or Firm*—Oblon, Spivak, McClelland, Maier & Neustadt, P.C.

(57) ABSTRACT

It is an object to provide a semiconductor device having an improved heat dissipation characteristic. A power element is mounted on and jointed and to a metal block through a jointing material. An insulating substrate includes a ceramic substrate and metal layers formed on both surfaces of the ceramic substrate and having thicknesses equal to each other. The metal block and the insulating substrate are provided per insulation unit of the power element. The metal layer of the insulating substrate is joined to a surface of the metal block through a jointing material opposite to a surface thereof for forming the power element. An electrode terminal is attached to a surface of the metal block having a power element joined thereto through ultrasonic junction and the like. Electrode terminals are connected to electrodes of the power element through aluminum wires. The power element, the electrode terminals and the metal block are sealed with a resin package while the metal layer of the insulating substrate remains exposed. An external heat dissipator is attached to the exposed metal layer of the insulating substrate.

5 Claims, 8 Drawing Sheets

SEMICONDUCTOR DEVICE

BACKGROUND OF THE INVENTION

1. Field of the Invention

The present invention is directed to a structure of a semiconductor device. More particularly, it is directed to a structure of a power semiconductor device used for power control.

2. Description of the Background Art

Figure 10:
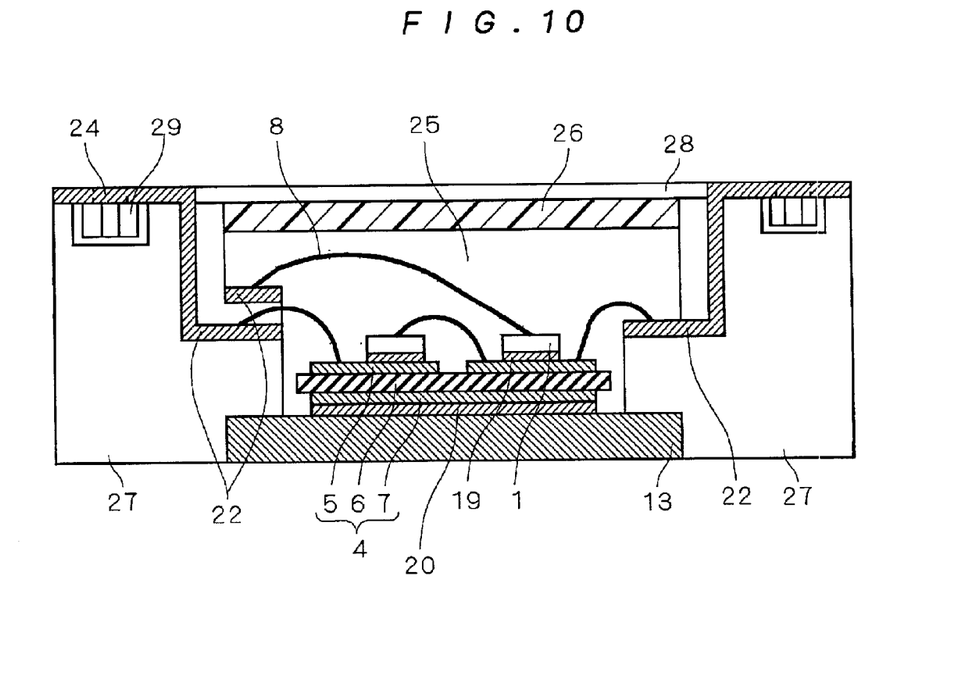
FIG. 10 is a cross-sectional view schematically showing the structure of a power semiconductor device in the background art.

FIG. 10 is a cross-sectional view schematically showing the structure of a power semiconductor device in the background art. The power semiconductor device in the background art includes power elements 1, a base plate 13, an insulating substrate 4, a case 27 having electrode terminals 22 attached thereto and a cover 28.

The insulating substrate 4 consists of a ceramic substrate 6 made of alumina, aluminum nitride or silicon nitride, for example, and metal layers 5, 7 formed on both surfaces of the ceramic substrate 6. The power element 1 is joined onto the metal layer through solder 19. Further, a circuit pattern is formed on the metal layer 5. The base plate 13 made of copper or the like acts as a heat sink for heat dissipation. The metal layer 7 of the insulating substrate 4 is joined onto the base plate 13 through solder 20. The power element 1 and the insulating substrate 4 are so contained in the case 27 that the base plate 13 has an exposed surface opposite to the surface thereof for forming the insulating substrate 4.

The power element 1 is connected to the electrode terminal 22 inside the case 27 and to the circuit pattern on the metal layer 5 through aluminum wires 8. The case 27 is filled with a silicon gel 25 to cover the power element 1, the insulating substrate 4 and the base plate 13. An upper portion of the case 27 is sealed with an epoxy resin 26. Further, the cover 28 is attached to the case 27. Although not shown in FIG, 10, an external heat dissipator may be provided to the surface of the base pate 13 exposed from the case 27.

One of the electrode terminals 22 drawn to an outside of the case 27 is provided with a screw hole 24. This electrode terminal 22 is arranged in such a position that a center of a nut 29 for attaching electrode and a center of the screw hole 24 coincide with each other. An electrode terminal of an external device (not shown) is arranged on the electrode terminal 22 and a screw (not shown) is inserted in the screw hole 24 from the outside of the case 27. The screw is thereby threadedly engaged with the nut 29 buried in the case 27 for attaching electrode to establish connection and fixation of the electrode terminal of the external device to the electrode terminal 22.

In the power semiconductor device according to the background art, heat generated at the power element 1 is dissipated to the outside from the external heat dissipator (not shown) through the solder 19, the insulating substrate 4, the solder 20 and the base plate 13. The base plate 13 and the external heat dissipator are made of copper and the like having a heat conductivity of about 380 W/mK. The heat conductivity of the solders 19 and 20 ranges from 20 to 30 W/mK. The insulating substrate 4 consisting of the metal layers 5, 7 and the ceramic substrate 6 has a heat conductivity determined mainly by the heat conductivity of the ceramic substrate 6 to range from 20 to 180 W/mK. That is, the solders 19, 20 and the insulating substrate 4 have conductivities that are lower than the heat conductivities of the base plate 13 and the external heat dissipator by a large degree. Further, as the solders 19, 20 and the insulating substrate 4 are arranged directly under the power element 1, areas in each of these elements through which heat generated by the power element 1 passes are approximately the same as the area of the power element 1. For this reason, the solders 19, 20 and the insulating substrate 4 become major obstruction to heat conduction.

Alumina is the material of a high frequency of use for the ceramic substrate 6. Alternatively, another material such as aluminum nitride may be used in some cases having a heat conductivity higher than that of alumina for improvement in heat conduction of the insulating substrate 4. However, as aluminum nitride is more costly than alumina, increase in material cost has been caused.

SUMMARY OF THE INVENTION

A first aspect of the present invention is directed to a semiconductor device, comprising: a semiconductor element having an electrode; a metal block having a first surface and a second surface opposite to the first surface; an electrode terminal jointed to the first surface of the metal block; and a ceramic substrate jointed to the second surface of the metal block and having metal layers formed on both surfaces, wherein the semiconductor element and the electrode are joined to the first surface of the metal block through a jointing material.

According to a second aspect of the present invention, in the semiconductor device according to the first aspect, the metal layers formed on the both surfaces of the ceramic substrate are the same with each other in thickness.

According to a third aspect of the present invention, in the semiconductor device according to the first or second aspect, the semiconductor element includes a plurality of semiconductor elements; the metal block and the ceramic substrate are separated per insulation unit of at least one of the plurality of semiconductor elements; one of the metal block and the ceramic substrate is provided to be in corresponding to at least one of the plurality of semiconductor elements; and another one of the metal block and the ceramic substrate extends over all of the plurality of semiconductor elements for forming the insulation unit.

A fourth aspect of the present invention is directed to a semiconductor device, comprising: a metal block having a first surface and a second surface opposite to the first surface; a semiconductor element jointed to the first surface of the metal block through a jointing material; a resin insulating layer having a third surface and a fourth surface opposite to the third surface, the third surface being joined to the second surface of the metal block; and a resin package for sealing the metal block and the semiconductor element, wherein the fourth surface of the resin insulating layer is exposed, and the resin insulating layer has an elasticity higher than that of the resin package.

According to a fifth aspect of the present invention, in the semiconductor device according to the fourth aspect, the resin insulating layer is made of a silicon resin including a ceramic material for filing the silicon resin.

According to a sixth aspect of the present invention, in the semiconductor device according to the fourth or fifth aspect, the metal block is provided per insulation unit of the semiconductor element.

According to a seventh aspect of the present invention, in the semiconductor device according to any one of the first to sixth aspects, the metal block includes a surface having a region larger than that of the jointing material on a side opposite to the jointing material.

According to an eighth aspect of the present invention, in the semiconductor device according to any one of the first to seventh aspects, a gap between the metal block and the semiconductor element becomes wider as a distance from a center of the semiconductor element becomes longer, and the gap is filled with the jointing material.

In the semiconductor device according to the first aspect of the present invention, the metal block having a satisfactory heat conductivity is provided at a position closer to the semiconductor element for generating heat than a position of the ceramic substrate as the major obstruction to heat conduction. As a result, a satisfactory heat dissipation characteristic is obtained.

Further, as the ceramic substrate is provided to the metal block, the ceramic substrate may be responsible for a dielectric breakdown voltage. As a result, the material for the jointing material can be selected in terms of heat conductivity without the need of considering dielectric breakdown voltage.

The semiconductor device according to the first aspect has a further advantage in that as the electrode of the semiconductor element and the electrode terminal are connected through the metal block, reduction in power loss of the semiconductor device is realized.

In the semiconductor device according to the second aspect of the present invention, the metal layers formed on both surfaces of the ceramic substrate have thicknesses equal to each other. Therefore, the amount of warping in the ceramic substrate can be reduced when the ceramic substrate is jointed to the metal block. For this reason, flatness of a contact surface of the ceramic surface to which an external heat dissipator may be attached can be increased, to thereby improve a heat dissipation characteristic.

In the semiconductor device according to the third aspect of the present invention, the metal block and the ceramic substrate are provided per insulation unit of the semiconductor element. Therefore, a plurality of semiconductor elements can be provided to a single semiconductor device while electrical insulation among the semiconductor elements is maintained.

Further, as the semiconductor elements can be connected among one another using the metal block, wiring flexibility is increased.

In the semiconductor device according to the fourth aspect of the present invention, the resin insulating layer has a satisfactory elasticity. Therefore, it is possible to reduce gap between the resin insulating layer and an external heat dissipator attached to the resin insulating layer, to thereby eliminate the necessity of coating with grease for heat dissipation. As a result, reduction in material cost and improvement in productivity and heat dissipation characteristic of the semiconductor device is realized.

Further, the metal block having a satisfactory conductivity is provided at a position closer to the semiconductor element for generating heat than the position of the resin insulating layer as the major obstruction to heat conduction. As a result, a satisfactory heat dissipation characteristic is obtained.

The semiconductor device according to the fourth aspect has a further advantage in that as the resin insulating layer is provided to the metal block, the resin insulating layer may be responsible for a dielectric breakdown voltage. As a result, the material for the jointing material can be selected in terms of heat conductivity without the need of considering dielectric breakdown voltage.

In the semiconductor device according to the fifth aspect of the present invention, the resin insulating layer includes a ceramic powder having a satisfactory heat conductivity for filling the resin insulating layer. Therefore, it is possible to improve a heat dissipation characteristic.

In the semiconductor device according to the sixth aspect of the present invention, the metal block is provided per insulation unit of the semiconductor element. Therefore, it is possible to maintain electrical insulation among each semiconductor element.

In the semiconductor device according to the seventh aspect of the present invention, the metal block includes a surface having a region larger than that of the jointing material. Therefore, heat from the semiconductor element can be diffused, to allow heat to pass through a material as the major obstruction to heat conduction within a larger area. As a result, a heat dissipation characteristic is improved.

In the semiconductor device according to the eighth aspect of the present invention, as a gap between the metal block and the semiconductor element becomes wider as a distance from a center of the semiconductor element becomes longer, the thickness of the jointing material is greater in the periphery of the semiconductor element than the thickness at the center of the same. As a result, the amount of cracks can be reduced.

It is an object of the present invention to provide a semiconductor device having an improved heat dissipation characteristic.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
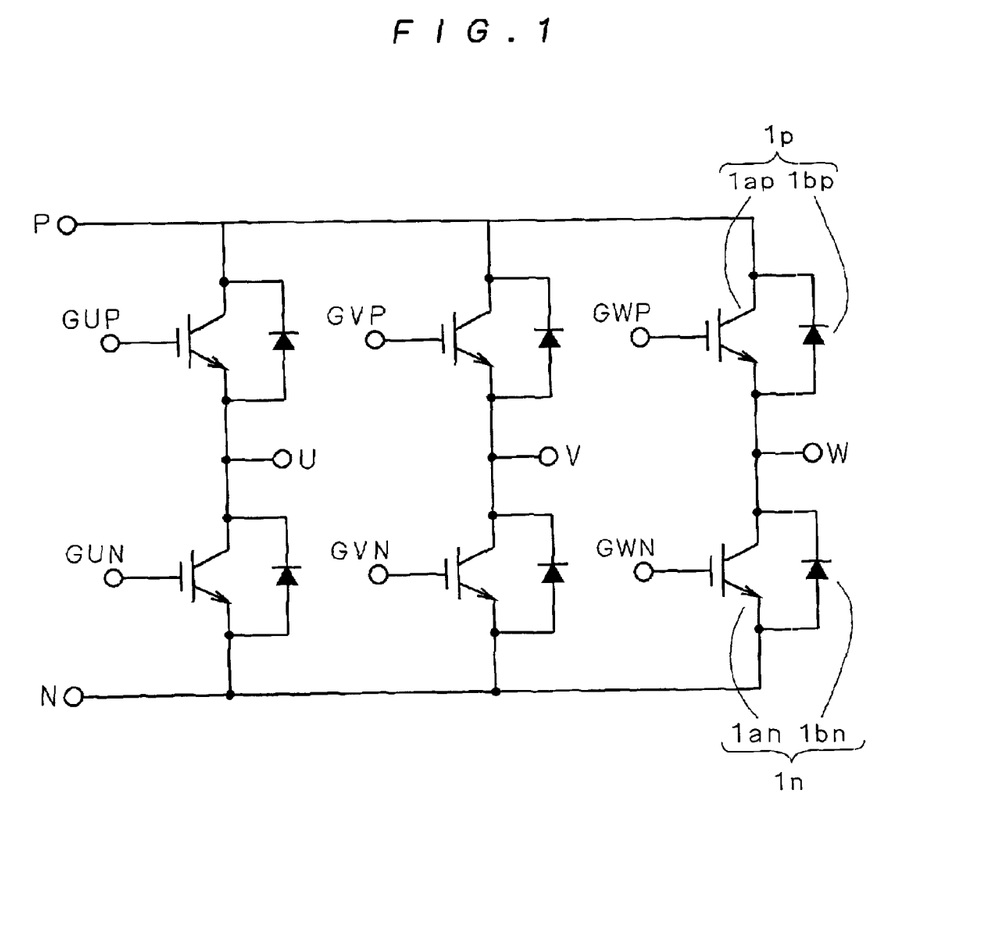
FIG. 1 is a circuit diagram showing the semiconductor device according to a first preferred embodiment of the present invention.

FIG. 1 is a circuit diagram showing a semiconductor device according to the first preferred embodiment. As shown in FIG. 1, the semiconductor device according to the first preferred embodiment consists of a three-phase inverter circuit, for example. More particularly, output terminals U, V and W may be connected to an AC motor. Input terminals P and N may be directly connected to a DC power supply or to an output of a power rectifier circuit for generating a DC voltage from a commercial power supply. A power element $1p$ provided on the P side includes an IGBT $1ap$ and a diode $1bp$ connected in inverse-parallel connection to the IGBT $1ap$. A power element in provided on the N side includes an IGBT $1an$ and a diode $1bn$ connected in inverse-parallel connection to the IGBT $1an$. The structure connecting the power element $1p$ and the power element $1n$ in series is called as arm. The semiconductor device according to the first preferred embodiment includes three arms connected in parallel. Control terminals GUP, GUN, GVP, GVN, GWP and GWN are controlled so that each IGBT is turned on/off, to thereby control rotational motion of an AC motor. The elements including an electrode terminal $2b$, a metal block 3, an insulating substrate 4, metal layers 5, 7 and a ceramic substrate 6 to be described later will be designated hereinafter by the reference signs having no p or n at each end when distinction between the side of the P side and the N side is not necessary.

Figure 2:
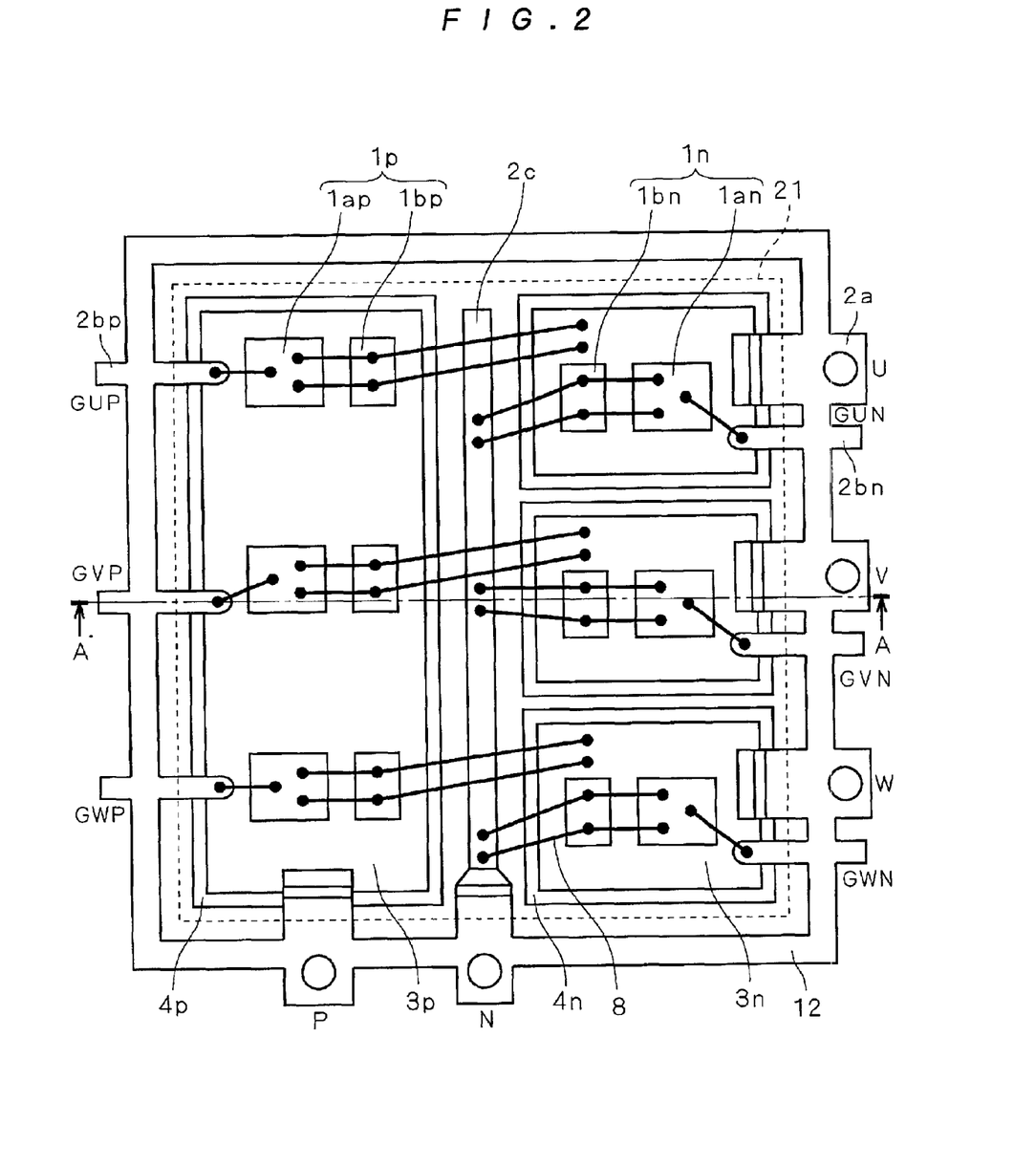
FIG. 2 is a plan view schematically showing a structure of the semiconductor device according to the first preferred embodiment of the present invention.
Figure 3:
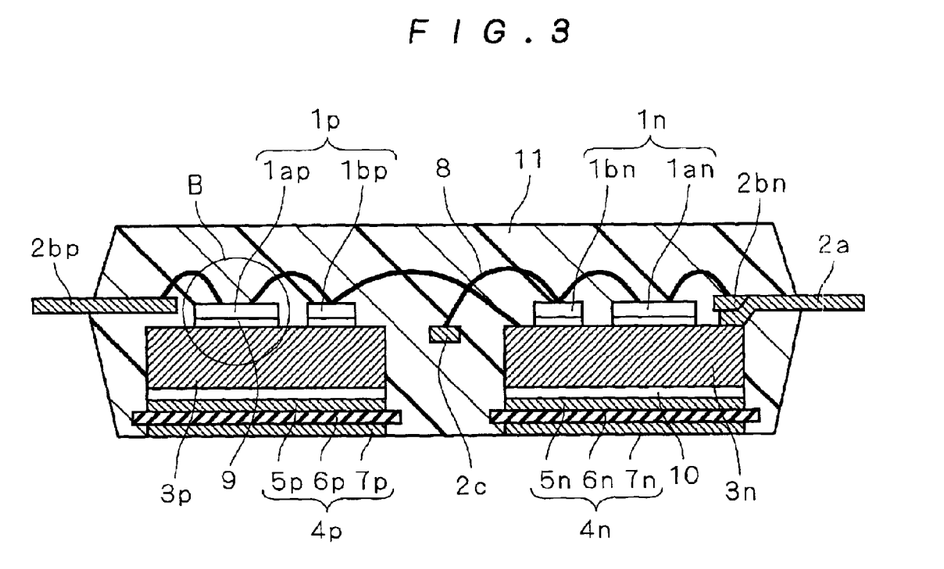
FIG. 3 is a cross-sectional view showing the structure of the semiconductor device according to the first preferred embodiment o the present invention.

FIG. 2 is a plan view schematically showing the structure of the semiconductor device according to the first preferred embodiment having the circuit configuration shown in the diagram of FIG. 1. FIG. 3 is a cross-sectional view at an arrow A—A in FIG. 2 showing the structure of the semiconductor device after a resin package is formed.

As shown in FIGS. 2 and 3, the semiconductor device according to the first preferred embodiment includes the power elements 1, electrode terminals $2a$, $2b$, $2c$, the metal blocks 3, the insulating substrate 4 and a resin package 11. To encourage a clear understanding of the structure, the resin package 11 is not shown in FIG. 2. A region 21 for forming the resin package 11 is shown instead. The electrode terminals $2a$, $2b$ and $2c$ are connected through a tie bar 12, which is cut after formation of the resin package 11 to separate the electrode terminals from one another.

Figure 4:
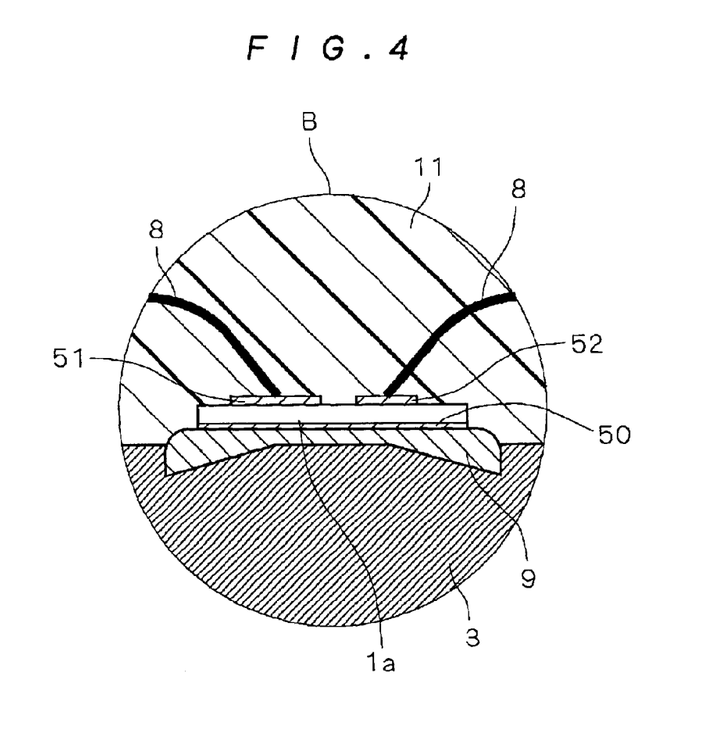
FIG. 4 is a cross-sectional view showing a part of the structure of the semiconductor device according to the first preferred embodiment of the present invention in an enlarged manner.
Figure 5:
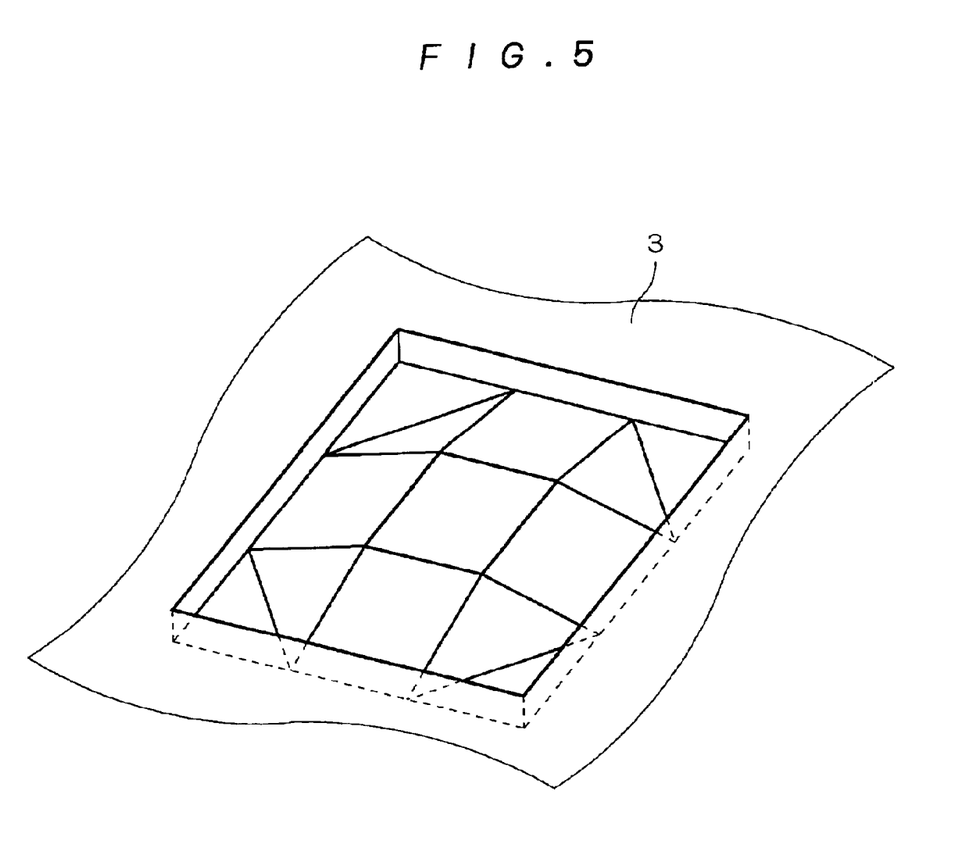
FIG. 5 is a perspective view from a surface of a metal block 3 on which a power element 1 is mounted.

FIG. 4 is a cross-sectional view showing a part B of FIG. 3 in an enlarged manner. FIG. 5 is a perspective view from the surface of the metal block 3 on which the power element 1 is mounted. As shown in FIG. 4, the IGBT $1a$ of the power element 1 has one main surface for forming a collector electrode 50 and the other main surface for forming a gate electrode 51 and an emitter electrode 52. The IGBT $1a$ is mounted on the metal block 3 through a jointing material 9 in such a way that the collector electrode 50 is in contact with the metal block 3. The metal block 3 is made of copper or the like, and the jointing material 9 is made of solder or conductive resin, for example. As shown in FIGS. 4 and 5, the surface of the metal block 3 having the power element 1 mounted thereon has such a shape that a gap between the surface and the IGBT $1a$ mounted thereon becomes wider as the distance from the center of the IGBT $1a$ becomes longer. As this gap is filled with the jointing material 9, the thickness of the jointing material 9 is greater in the periphery of the IGBT $1a$ than the thickness of the jointing material 9 at the center of the IGBT $1a$. Although not shown, the diode $1b$ has one main surface for forming a cathode electrode and the other main surface for forming an anode electrode. The diode $1b$ is mounted on the metal block 3 through the jointing material 9 in such a way that the cathode electrode is in contact with the metal block 3. The surface of the metal block 3 having the diode $1b$ mounted thereon has such a shape that a gap between the surface and the diode $1b$ also becomes wider as the distance from the center of the diode $1b$ becomes longer.

The insulating substrate 4 consists of the ceramic substrate 6 made of alumina, aluminum nitride or silicon nitride, for example, and the metal layers 5, 7 formed on both surfaces of the ceramic substrate 6 and having thicknesses equal to each other. The ceramic substrate 6 has a thickness ranging from 0.3 to 1.0 mm, for example. The metal block 3 and the insulating substrate 4 are provided per insulation unit of the power element 1. That is, the semiconductor device according to the first preferred embodiment includes metal blocks $3p$, $3n$ and insulating substrates $4p$, $4n$ provided with no dependence on the structure of arm but respectively provided to both of the P side and the N side. A metal layer $5p$ of the insulating substrate $4p$ is joined to the surface of the metal block $3p$ through a jointing material 10 opposite to the surface thereof for forming the power element $1p$. A metal layer $5n$ of the insulating substrate $4n$ is joined to the metal block $3n$ in a same way as the metal layer $5p$. The surface of the metal block 3 opposite to the surface thereof for forming the power element 1 joined thereto has a region larger than the joint surface to the power element 1. The jointing material 10 is made of solder, for example.

The electrode terminal $2a$ is attached to the surface of the metal block $3n$ having the power element 1 joined thereto through ultrasonic junction and the like. Due to this, the electrodes of the power element $1n$ joined onto the metal block $3n$, namely, the collector electrode 50 of the IGBT $1an$ and the cathode electrode of the diode $1bn$ (not shown), are connected to the electrode terminal $2a$ through the metal block $3n$. An electrode terminal $2bp$ is connected to the gate electrode 51 of the IGBT $1ap$ and an electrode terminal $2bn$ is connected to the gate electrode 51 of the IGBT $1an$ through aluminum wires 8, respectively. The electrode terminal $2c$ is connected to the emitter electrode 52 of the IGBT $1an$ and the anode electrode of the diode $1bn$ through the aluminum wires 8. Further, the emitter electrode 52 of the IGBT $1ap$ and the anode electrode of the diode $1bp$ are connected to the metal block $3n$ having the power element In joined thereto through the aluminum wires 8.

The resin package 11 is made of an epoxy resin, for example, for sealing the power element 1, the electrode terminals $2a$, $2b$, $2c$ and the metal block 3 while the metal layer 7 of the insulating substrate 4 remains exposed. Although not shown in FIG. 3, an external heat dissipator may be provided to the exposed metal layer 7 of the insulating substrate 4.

Figure 6A:
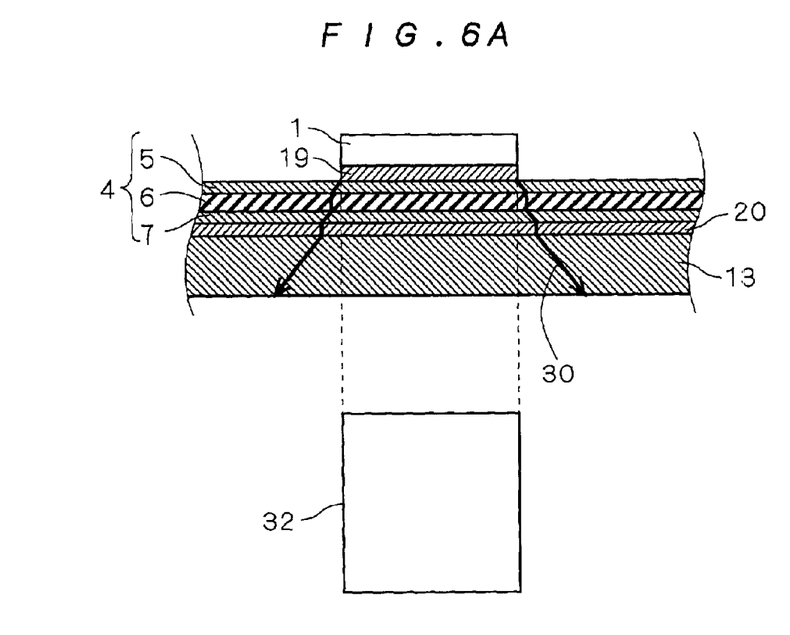
FIGS. 6A and 6B are views showing conduction of heat generated at the power element 1.
Figure 6B:
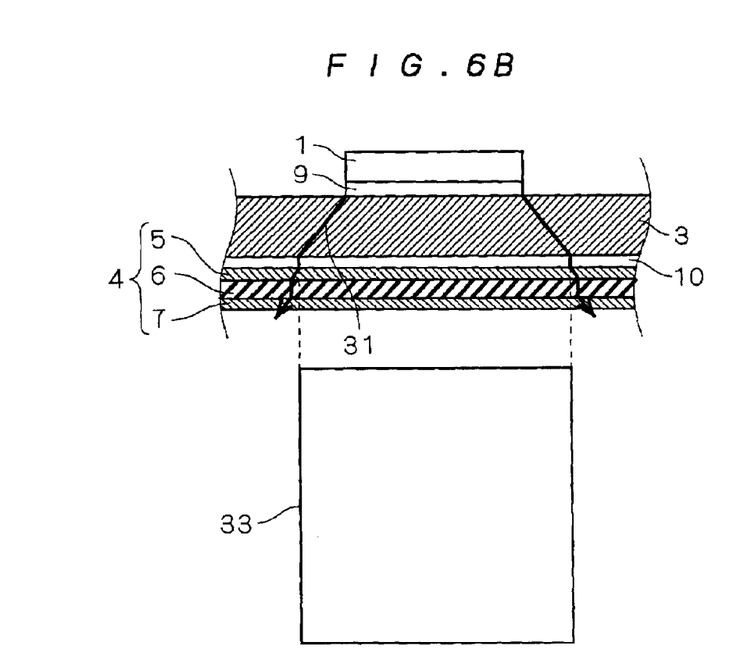

In the semiconductor device according to the first preferred embodiment having the structure described above, heat generated at the power element 1 is dissipated to the outside from the external heat dissipator (not shown) through the jointing material 9, the metal block 3 and the insulating substrate 4. FIGS. 6A and 6B are views showing conduction of heat generated at the power element 1. FIG. 6A shows heat conduction in the semiconductor device in the background art described above and FIG. 6B shows heat conduction in the semiconductor device according to the first preferred embodiment. When the jointing materials 9 and 10 are made of solder, for example, heat conductivities of the jointing materials 9 and 10 are considered to be equal to those of the solders 19 and 20. Moreover, when the metal block 3 is made of copper as the base plate 13, the heat conductivity of the metal block 3 is also considered to be equal to that of the base plate 13. In view of these factors, the jointing materials 9, 10 and the insulating substrate 4 having the conductivities lower than that of the metal block 3 are the major obstruction to heat conduction in the first preferred embodiment as in the power semiconductor device in the background art described above.

As shown by a direction 30 of heat dissipation in FIG. 6A, before passing through the base plate 13 having a satisfactory heat conductivity, heat generated at the power element 1 passes through the solders 19, 20 and the insulating substrate 4 that are the major obstruction to heat conduction in the power semiconductor device in the background art. Therefore, heat passes through the insulating substrate 4 within an area 32 that is approximately the same as the area of the power element 1. In the semiconductor device according to the first preferred embodiment, on the other hand, heat generated at the power element 1 passes through the jointing material 9 which is one of the major obstruction to heat conduction and then through the metal block 3 having a satisfactory heat conductivity as shown by a direction 31 of heat dissipation in FIG. 6B. Next, heat passes through the jointing material 10 and the insulating substrate 4 that are the remaining major obstruction to heat conduction. Due to this, heat generated at the power element 1 is dissipated at the metal block 3 in a horizontal direction, namely, in a direction perpendicular to a direction of thickness of the metal block 3, and then passes through the jointing material 10 and the insulating substrate 4. That is, heat passes through the insulating substrate 4 within an area 33 that is sufficiently larger than the area of the power element 1.

In the semiconductor device according to the first preferred embodiment, while heat passes through the jointing material 9 as the major obstruction to heat conduction within an area that is approximately the same as the area of the power element 1, heat passes through the jointing material 10 and the insulating substrate 4 as the remaining major obstruction to heat conduction within an area sufficiently larger than the area of the power element 1. Therefore, as compared with the power semiconductor device in the background art, a heat dissipation characteristic can be improved in semiconductor device according to the first preferred embodiment. As a result, while the structure of the power semiconductor device in the background art requires aluminum nitride as the material for the ceramic substrate 6 to obtain a satisfactory heat dissipation characteristic, a heat dissipation characteristic comparable to that of the power semiconductor device in the background art can be obtained in the semiconductor device according to the first preferred embodiment by using alumina less costly than aluminum nitride as the ceramic substrate 6. For this reason, it is possible to provide a customer with a semiconductor device having excellence in cost efficiency.

Thermal stress is caused in the jointing material 9 due to a difference in linear expansion coefficient between the metal block 3 and the power element 1, to thereby cause distortion in the jointing material 9. As a distance from the center of the power element 1 becomes longer, this thermal stress becomes stronger. Therefore, cracks are likely to occur in the jointing material 9 from the four corners of the power element 1. Further, as the jointing material 9 increases more in thickness, distortion to be caused in the jointing material 9 is decreased per unit thickness. In the first preferred embodiment, as the thickness of the jointing material 9 is greater in the periphery of the power element 1 than the thickness of the same at the center of the power element 1, the amount of cracks can be reduced.

As the metal block 3 and the insulating substrate 4 are provided per insulation unit of the power element 1, electrical insulation among each power element 1 can be maintained.

As the metal layers 5 and 7 of the insulating substrate 4 have the thicknesses equal to each other, the amount of warping in the insulating substrate 4 can be reduced when the insulating substrate 4 is jointed to the metal block 3. For this reason, flatness of a contact surface of the insulating substrate 4 with the external heat dissipator (not shown) can be increased, to thereby improve a heat dissipation characteristic.

Further, the power element 1 is sealed with the case 27, the cover 28, the silicon gel 25 and the epoxy resin 26 in the power semiconductor device in the background art. The power element 1 is sealed only with the resin package 11 in the semiconductor device according to the first preferred embodiment. Therefore, reduction in material cost and manufacturing cost is realized.

Moreover, a large current flows through the metal layer 5 of the insulating substrate 4 and the aluminum wires 8 in the power semiconductor device in the background art. The thickness of the metal layer 5 ranges from 0.2 to 0.3 mm, for example, and the diameter of the aluminum wires 8 ranges from 0.2 to 0.5 mm, for example. In the semiconductor device according to the first preferred embodiment, while a current partially flows through the aluminum wires 8, a large current flows through the metal block 3 and the electrode terminal 2a directly connected to the metal block 3. The thickness of the metal block 3 ranges from 1.0 to 5.0 mm, for example, and the thickness of the electrode terminal 2a ranges from 0.5 to 1.2 mm, for example. As the metal block 3 and the electrode terminal 2a have thicknesses greater than those of the metal layer 5 and the aluminum wires 8 in the background art, electric resistance of the semiconductor device as a whole is lowered. Therefore, power loss of the semiconductor device can be reduced.

In FIG. 2, the emitter electrode 52 of the IGBT 1ap mounted on the metal block 3p is connected to the metal block 3n through the aluminum wires 8 to thereby establish connection between the emitter electrode 52 and the collector electrode 50 of the IGBT 1an mounted on the metal block 3n. As the metal block 3 is provided per insulation unit of the power element 1, the metal block 3 is applicable to perform wiring of the aluminum wires 8. Therefore, wiring flexibility of the aluminum wires 8 is increased.

In the first preferred embodiment, the metal block 3 and the electrode terminal 2a are separately provided and connected to each other through ultrasonic junction. Alternatively, the metal block 3 and the electrode terminal 2a may be integrally formed from a copper strip having different thicknesses. Further, connection between the metal block 3 and the electrode terminal 2a is established through ultrasonic junction in the first preferred embodiment. Alternatively, this connection may be established throug solder and conductive resin. Further alternatively, it can be mechanically established with screws.

In the first preferred embodiment, the jointing material 9 is defined to have a great thickness in the periphery of the power element 1 mounted on the metal block 3 so as to relieve the thermal stress to be caused in the jointing material 9. The amount of cracks to occur in the jointing material 9 can be reduced as well by using molybdenum, copper-molybdenum alloy, copper-tungsten alloy, a composite of SiC and aluminum and the like as the metal block 3 each having a relatively satisfactory heat conductivity and a low linear expansion coefficient.

Figure 7:
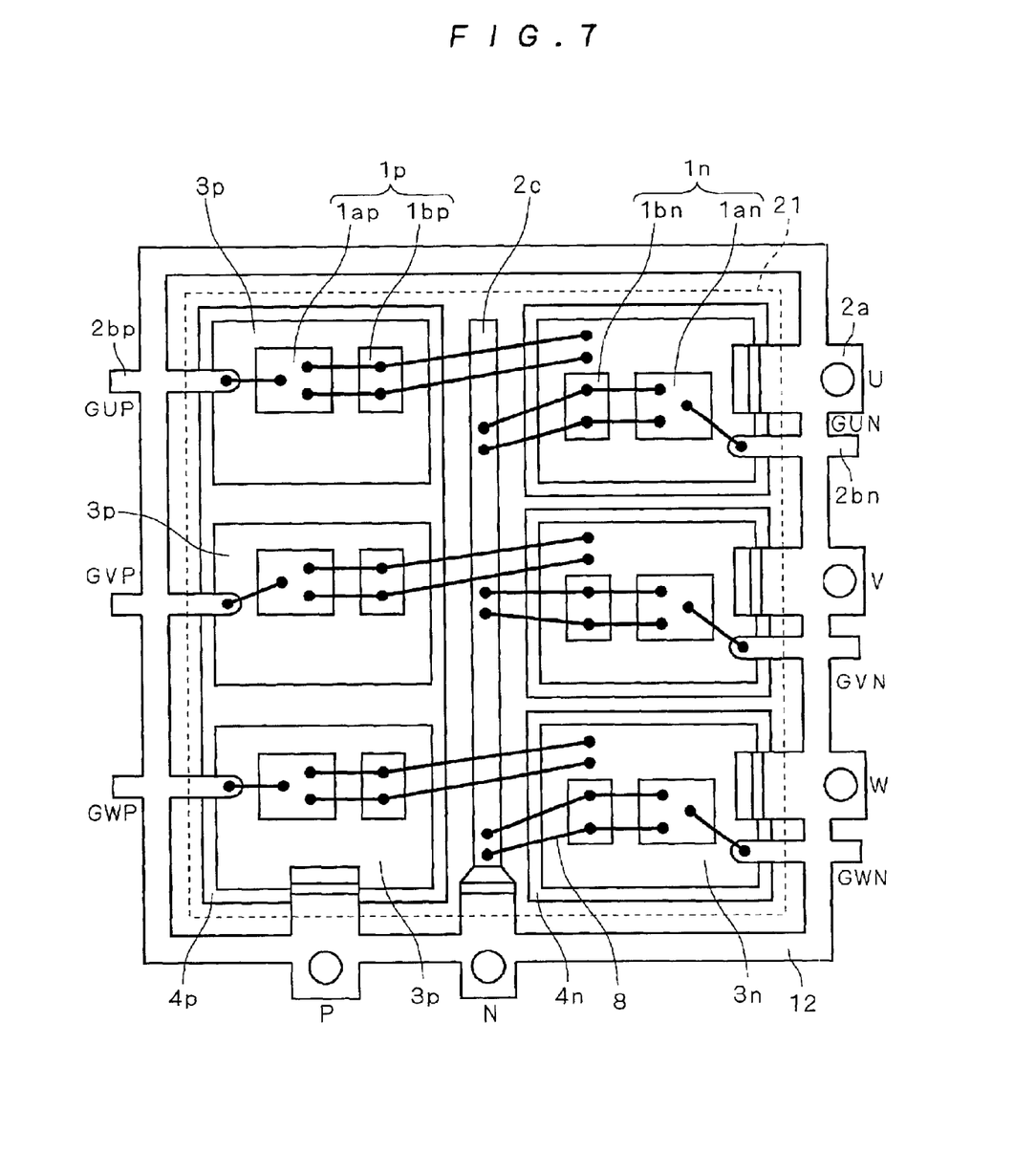
FIGS. 7 and 8 are plan views showing modifications of the semiconductor device according to the first preferred embodiment of the present invention.
Figure 8:
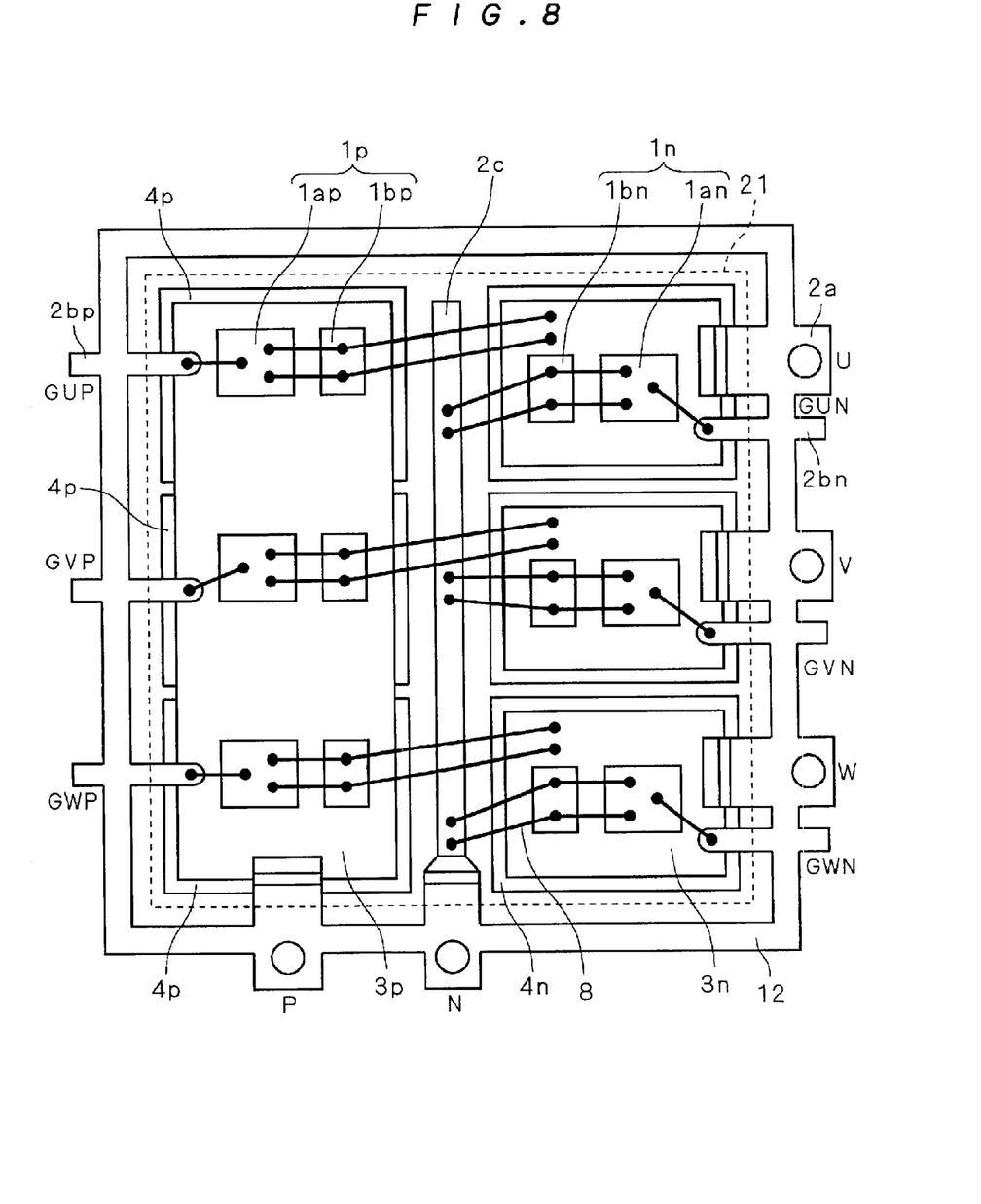

FIGS. 7 and 8 are plan views showing modifications of the semiconductor device according to the first preferred embodiment. As shown in FIG. 7, the insulating substrate 4p is provided to extend over all power elements 1p of the P side Here, similar to the metal blocks 3n of the N side, the metal block 3p of the P side may be separated per power element 1p in the semiconductor device according to the first preferred embodiment. At this time, the collector electrodes 50 of each IGBT 1ap are electrically connected to each other through the metal layer 5p of the insulating substrate 4p. As shown in FIG. 8, the metal block 3p is provided to extend over all power elements 1p of the P side. Here, similar to the insulating substrates 4n of the N side, the insulating substrate 4p of the P side may be separated per power element 1p in the semiconductor device according to the first preferred embodiment. At this time, the collector electrodes 50 of each IGBT 1ap are electrically connected to each other through the metal block 3p. That is, the metal block 3 and the insulating substrate 4 are separated per insulation unit of at least one of the power elements 1. When the insulating substrate 4 is provided to extend over all power elements 1 for forming insulation unit thereof, a plurality of metal blocks 3 each corresponding to at least one power element 1 may be provided. When the metal block 3 is provided to extend over all power elements 1 for forming insulation unit thereof, a plurality of insulating substrates 4 each corresponding to at least one power element 1 may be provided.

Second Preferred Embodiment

Figure 9:
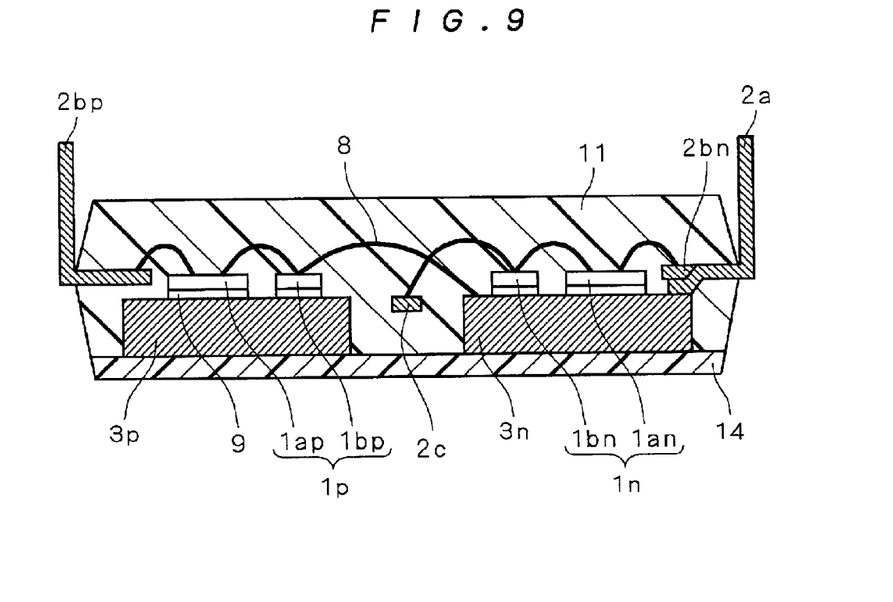
FIG. 9 is a cross-sectional view schematically showing the structure of a semiconductor device according to a second preferred embodiment of the present invention.

FIG. 9 is a cross-sectional view schematically showing the structure of a semiconductor device according to the second preferred embodiment. The semiconductor device according to the second preferred embodiment basically differs from the semiconductor device according to the first preferred embodiment described above in that a resin insulating layer 14 is substituted for the insulating substrate 4.

As shown in FIG. 9, the semiconductor device according to the second preferred embodiment includes the power elements 1, the electrode terminals 2a, 2b, 2c, the metal blocks 3, the resin insulating layer 14 and the resin package 11. The metal block 3 for forming the power element 1 mounted thereon is provided per insulation unit of the power element 1. The resin insulating layer 14 is provided to the surface of the metal block 3 opposite to the surface thereof for forming the power element 1 and extends over all metal blocks 3. Namely, a plurality of metal blocks 3 are mounted on the resin insulating layer 14. The resin insulating layer 14 is formed by mixing a ceramic powder as a filler into a silicon resin, for example. A kind of material such as silica, especially crystalline silica, alumina, aluminum nitride, silicon nitride and boron nitride or a mixed powder formed by mixing these materials together is applicable as a ceramic powder. The resin insulating layer 14 is defined to have a thickness of 0.2 to 0.5 mm, for example.

The resin package 11 is made of an epoxy resin, for example, for sealing the power element 1, the electrode terminals 2a, 2b, 2c and the metal block 3 while the resin insulating surface 14 remains exposed. Although not shown, an external heat dissipator may be provided to the exposed surface of the resin insulating layer 14. In the second preferred embodiment, the power element 1 and other elements are sealed with the resin package 11 after the resin insulating layer 14 is provided to the metal block 3. Alternatively, the power element 1, the electrode terminals 2a, 2b, 2c and the metal block 3 may be sealed with the resin package 11 while the surface of the metal block 3, opposite to the surface thereof for forming the power element 1 remains exposed, to thereafter form the resin insulating layer 14 for covering the exposed surface of the metal block 3 and the resin package 11 in the periphery of the exposed surface. As the other configurations of the semiconductor device according to the second preferred embodiments are the same as those of the semiconductor device according to the first preferred embodiment, the description thereof is omitted here.

According to the structures of the background art and the first preferred embodiment, the semiconductor device and the external heat dissipator fail to be in close contact with each other due to warping or flexure in the base plate 13 for holding the external heat dissipator and in the insulating substrate 4, or warping or flexure in the external heat dissipator. Therefore, a gap between the semiconductor device and the external heat dissipator is generated. Moreover, when a part of the resin package 11 made of an epoxy resin as well as the insulating substrate 4 has the external heat dissipator attached thereto in the first preferred embodiment, a gap may be generated for the same reason. As the gap between the semiconductor device and the external heat dissipator is the cause for degeneration of a heat dissipation characteristic, it is desirable to coat the gap with grease for heat dissipation in the structures of the background art and the first preferred embodiment. As a silicon resin is used as the resin insulating layer 14 for holding the external heat dissipator, the second preferred embodiment does not require grease for heat dissipation.

More particularly, as a silicon resin generally has an elasticity higher than that of a metal or an epoxy resin, stress that is caused during attachment of the external heat dissipator to the resin insulating layer 14 results in deformation of a silicon resin. The gap between the semiconductor device and the external heat dissipator can be thereby reduced. For this reason, a heat dissipation characteristic can be improved even when the amount of coating with grease for heat dissipation is reduced. In some cases, coating with grease for heat dissipation may be unnecessary. As a result, reduction in material cost and improvement in productivity is realized.

Grease for heat dissipation has a heat conductivity ranging from 1 to 2 W/mK that is lower than that of a metal. Due to this, grease for heat dissipation itself may be major obstruction to heat conduction. However, as the amount of coating with grease for heat dissipation is reduced, a heat dissipation characteristic can be improved in the second preferred embodiment. The second preferred embodiment employs a silicon resin as the material for the resin insulating layer 14. Alternatively, a resin having elasticity and insulation equal to those of a silicon resin such as polyurethane rubber and fluoro rubber may be applicable to achieve the same effects.

Further, the resin insulating layer 14 is filled with a ceramic powder having excellence in heat conductivity. Therefore, the semiconductor device according to the second preferred embodiment has an improved heat dissipation characteristic as compared with the semiconductor device including a resin insulating layer having no ceramic powder for filling the same.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a metal block having a first surface and a second surface opposite to said first surface;
   a semiconductor element joined to said first surface of said metal block through a jointing material;
   a resin insulating layer having a third surface and a fourth surface opposite to said third surface, said third surface being joined to said second surface of said metal block; and
   a resin package for sealing said metal block and said semiconductor element, wherein said fourth surface of said resin insulating layer is exposed, and said resin insulating layer has an elasticity higher than that of said resin package.

2. The semiconductor device according to claim 1, wherein said resin insulating layer is made of a silicon resin including a ceramic material for filling said silicon resin.

3. The semiconductor device according to claim 1, wherein said metal block is provided per insulation unit of said semiconductor element.

4. The semiconductor device according to claim 1, wherein said metal block includes a surface having a region larger than a surface of said jointing material on a side opposite to said jointing material, said surface of said jointing material lying on a side opposite to said semiconductor element.

5. The semiconductor device according to claim 1, wherein a gap between said metal block and said semiconductor element becomes wider as a distance from a center of said semiconductor element becomes longer; and said gap is filled with said jointing material.

* * * * *